United States Patent [19]

Olderdissen et al.

[11] Patent Number: 4,556,977
[45] Date of Patent: Dec. 3, 1985

[54] DECODING OF BCH DOUBLE ERROR CORRECTION - TRIPLE ERROR DETECTION (DEC-TED) CODES

[75] Inventors: Ulrich Olderdissen, Herrenberg; Hans Schumacher, Schönaich, both of Fed. Rep. of Germany

[73] Assignee: International Business Machines Corporation, Armonk, N.Y.

[21] Appl. No.: 532,639

[22] Filed: Sep. 15, 1983

[51] Int. Cl.[4] .................................. G06F 11/10
[52] U.S. Cl. .......................................... 371/37
[58] Field of Search ................. 371/37, 38, 39, 40

[56] References Cited

U.S. PATENT DOCUMENTS

| | | | |
|---|---|---|---|
| 3,714,629 | 1/1973 | Hong et al. | 371/37 |
| 4,099,160 | 7/1978 | Flagg | 371/37 |
| 4,142,174 | 2/1979 | Chen et al. | 371/37 |
| 4,320,510 | 3/1982 | Kojima | 371/37 |
| 4,360,916 | 11/1982 | Kustedjo et al. | 371/37 |
| 4,416,010 | 11/1983 | Hibino et al. | 371/37 |
| 4,468,769 | 8/1984 | Koga | 371/37 |

*Primary Examiner*—Charles E. Atkinson
*Attorney, Agent, or Firm*—James E. Murray

[57] ABSTRACT

Decoding of BCH multiple error correction code codewords with $\alpha$ as a primitive element of the finite field GF $(2^m)$ is accomplished by generating syndrome subvectors $S_1$ from all column m-tuple $\alpha^k$ positions and syndrome subvectors $S_2$ from all column m-tuple $\alpha^{3K}$ positions, generating a permutation of syndrome subvector $S_1$ for each bit position on the codeword and then selecting those bit positions K where $S_1^3+S_2+QK=0$ as the bit or bits in error.

2 Claims, 1 Drawing Figure

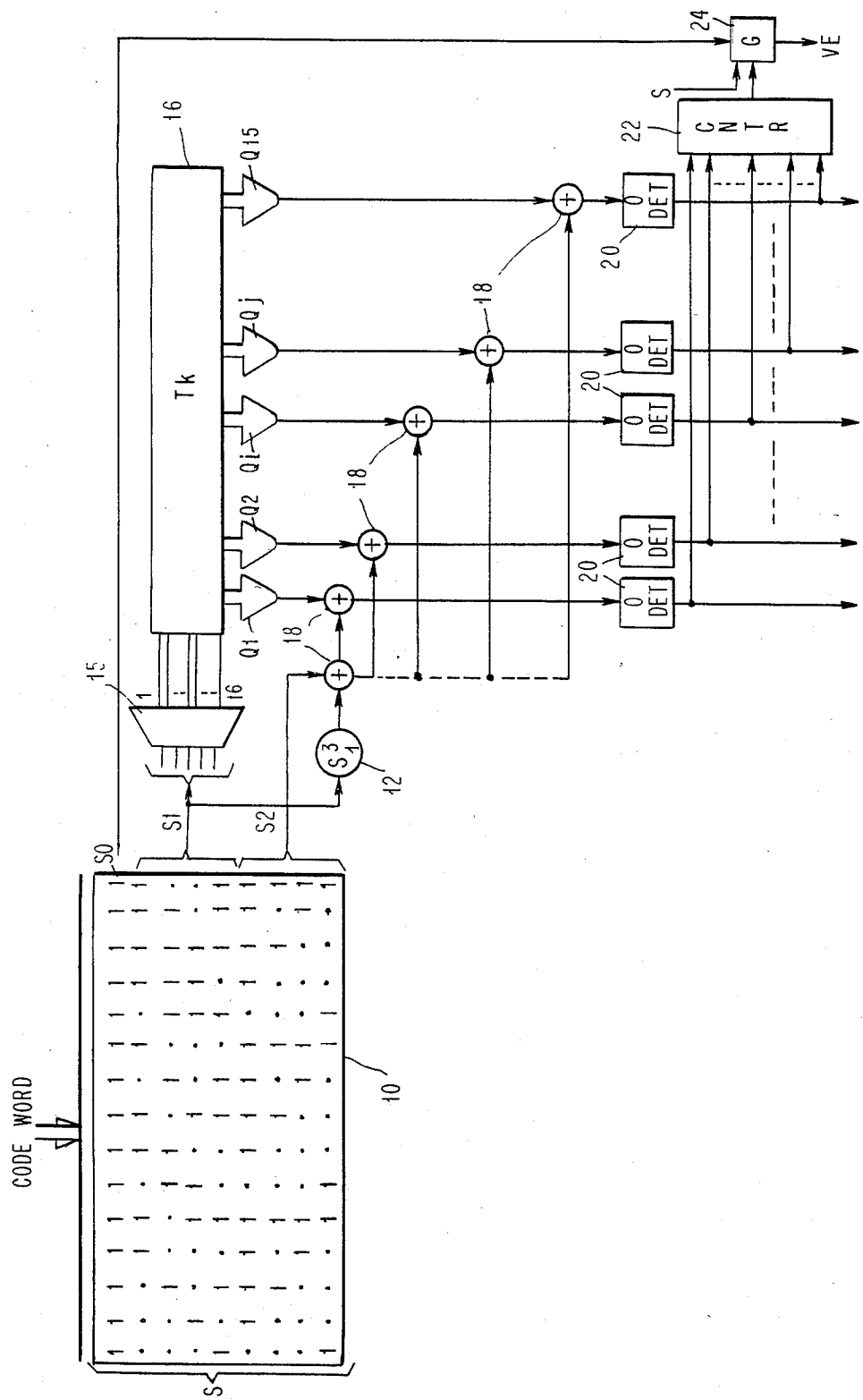

DECODING OF BCH DOUBLE ERROR CORRECTION - TRIPLE ERROR DETECTION (DEC-TED) CODES

BACKGROUND OF THE INVENTION

The present invention relates to error correcting codes for the correction of double errors and the detection of triple in memory arrays.

A double error correcting and triple error detecting (DEC-TED) code can be constructed based on the well known BCH coding theory (see W. W. Peterson and E. J. Weldon, Jr., *Error Correcting Codes*, 1972, MIT Press). To do this, let $\alpha$ be a primitive element of the finite field $GF(2^m)$, and let $n=2^m-1$. If an element of $GF(2^m)$ is then expressed as a binary m-tuple, a DEC-TED BCH code of length n can be defined as the code with the following ($\gamma \times n$) parity check matrix where each column consists of two m-tuples $\alpha^i$ and $\alpha^{3i}$ plus a leading 1:

$$H = \begin{matrix} 1 & 1 & 1 & 1 & 1 \\ 1 & \alpha & \alpha^2 & \alpha^i & \alpha^{n-1} \\ 1 & \alpha^3 & \alpha^6 & \alpha^{3i} & \alpha^{3(n-1)} \end{matrix} \quad (1)$$

The number of check bits $\gamma$ and the number of data bits k for this code are $2m+1$ and $n-2m-1$ respectively. If 128 data bits are to be protected by the code, it should be apparent that m must be 8 or larger and that there is a (255,238) DEC-TED BCH code with $n=255$, $k=238$, and $\gamma=17$.

In co-pending U.S. patent application Ser. No. 424,940 filed on Sept. 28, 1982 and entitled "Double Error Correction—Triple Error Detection Code" it is shown how a shortened (144, 128) code can be obtained from the (255,238) BCH code defined by the H matrix in (1). In the mentioned co-pending application, it is shown how BCH codes can be decoded using a split look-up table technique to minimize the number of circuits needed to locate the bits in error. In certain applications, more rapid decoding is needed than is provided by the split decoder technique.

THE INVENTION

Therefore, in accordance with the present invention more rapid decoding is provided for BCH codes such as the one described in the co-pending application.

In the absence of an error in the n-bit code vector v of the described DEC-TED BCH codes, the syndrome vector is $S=H \times v=0$. In case of a 1-bit error at position i, the syndrome vector is equal to the column vector $C_i$ of H, i.e.:

$$S=C_i=(1, \alpha^i, \alpha^{3i}) \quad (2)$$

For two errors occurring at positions i and j, the syndrome vector is $$S=C_i \oplus C_j. \quad (3)$$

Therefore, the result of the Exclusive-OR (XOR) of S with one of the column vectors of H belonging to a defective bit position is the column vector of the other defective bit, i.e., $S \oplus C_i = C_j$.

From the H matrix (1) and equations (2) and (3) it follows that:

$$S_1 = \alpha^i \oplus \alpha^j, \text{ and } \alpha^i = S_1 \oplus \alpha^j$$

$$S_2 = \alpha^{3i} \oplus \alpha^{3j} = (S_1 \oplus \alpha^j)^3 \oplus \alpha^{3j} \quad (4)$$

$S_1$ is a syndrome vector generated from the m-tuple $\alpha^K$ in all bit positions of the codeword and $S_2$ is a syndrome vector generated from the m-tuple $\alpha^{3K}$ in all bit positions of the codeword.

Thus, K is an erroneous bit positions if and only if $$(S_1 \oplus \alpha^K)^3 = S_2 \oplus \alpha^{3K} \quad (5)$$

Equation (5) can be simplified to $$S_1^3 \oplus S_1^2 \alpha^K \oplus S_1 \alpha^{2K} \oplus S_2 = 0 \quad (6)$$

As $[f(X)]^2 = f(X^2)$, the term $S_1^2 \alpha^K \oplus S_1 \alpha^{2K}$ is a linear function of $S_1$, i.e., $$S_1^2 \alpha^K \oplus S_1 \alpha^{2K} = T_k \times S_1 = Q_K \quad (7)$$

where $T_k$ is a transformation matrix with $\alpha^K = (\alpha_{K0}, \alpha_{K1}, \alpha_{K2}, \ldots \alpha_{K(m-1)})$.

Therefore, equation (6) can be rewritten as $$S_1^3 \oplus S_2 \oplus Q_K = 0 \quad (8)$$

With formula (8) bits in error i and/or j can be located by generating the syndrome subvectors $S_1$ and $S_2$ and $Q_K$ for each of the bit positions of the codeword and selecting those bit positions where $S_1^3 + S_2 + Q_K = 0$ as the bits in error.

Therefore, it is an object of the present invention to provide a new decoding scheme for use in correcting single and double bit errors and detecting triple bit errors.

It is another object of the invention to rapidly decode codewords encoded using BCH error correcting codes.

It is a further object of the invention to make efficient use of logic circuits in decoding codewords encoded using BCH codes.

THE DRAWINGS

These and other objects of the invention can be best understood by reference to the embodiment of the invention illustrated in the accompanying drawing which is a schematic for an ECC decoder for a double error correcting triple error detecting code generated with BCH coding theory.

DETAILED DESCRIPTION

A (15,7) code with $\alpha^4 = \beta + 1$ is used in this detailed description of one embodiment of the present invention.

The H matrix generated from (1) with this polynomial is $$H = \begin{matrix} 1\,1\,1\,1\,1\,1\,1\,1\,1\,1\,1\,1\,1\,1\,1 & -p = S_0 \\ 0\,0\,0\,1\,0\,0\,1\,1\,0\,1\,0\,1\,1\,1\,1 & -s_0 = S_1 \\ 0\,0\,1\,0\,0\,1\,1\,0\,1\,0\,1\,1\,1\,1\,0 & -s_1 \\ 0\,1\,0\,0\,1\,1\,0\,1\,0\,1\,1\,1\,1\,0\,0 & -s_2 \\ 1\,0\,0\,0\,1\,0\,0\,1\,1\,0\,1\,0\,1\,1\,1 & -s_3 \\ 0\,1\,1\,1\,1\,0\,1\,1\,1\,1\,0\,1\,1\,1\,1 & -t_0 = S_2 \\ 0\,0\,1\,0\,1\,0\,0\,1\,0\,1\,0\,0\,1\,0\,1 & -t_1 \\ 0\,0\,0\,1\,1\,0\,0\,0\,1\,1\,0\,0\,0\,1\,1 & -t_2 \\ 1\,0\,0\,0\,1\,1\,0\,0\,0\,1\,1\,0\,0\,0\,1 & -t_3 \end{matrix} \quad (9)$$

In matrix (9) $m=4$ and $S_1=(s_0, \ldots, s_3)$, and $S_2 = S_1^3 = (t_0, \ldots, t_3)$ are 4-element vectors.

As can be seen from the drawing, the 15 bit codeword is fed into the syndrome generator 10 where the syndrome vector S is generated in accordance with the H matrix (9). The H matrix (9) is reproduced in the drawing to show the bit positions in the codeword that must be XOR together to generate one of the elements or bits of the syndrome vector S. The top most row of the matrix shows what bits are used to generate the parity syndrome bit p. The next four rows show what bits of the codeword generate the bits $s_1$ to $s_4$ making up the first m-tuple syndrome vector $S_1$ while the lower four rows show what bits of the codewords are needed to generate the syndrome bits $t_0$, $t_1$, $t_2$, $t_3$ for the second m-tuple $S_2$. The syndrome $S_1$ is cubed $(s_0 \oplus s_1 \alpha \oplus s_2 \alpha^2 \oplus s_3 \alpha^3)^3$ by XOR matrix circuit 12 to generate the term $S_1$ in (8). This generated $S_1^3$ is then XOR'ed with $S_2$ in XOR circuit 14 to produce the term $S_1^3 \oplus S_2$ in (8). In accordance with (8) when the term $S_1^3 \oplus S_2$ equals $Q_K$ where K is any bit and $Q = S_1 T_K$. $T_K$ is a transformation matrix with $\alpha^K = (a_{K0}, a_{K1}, a_{K2}, a_{K3})$ we get $$T_k = \begin{matrix} a_{K2} & a_{K2} \oplus a_{K3} & a_{K0} \oplus a_{K1} & a_{K1} \\ a_{k1} \oplus a_{K2} & a_{K0} & a_{K0} \oplus a_{K3} & a_{K2} \\ a_{K1} \oplus a_{K2} \oplus a_{K3} & a_{K0} \oplus a_{K3} \oplus a_{K2} & a_{K0} \oplus a_{K1} \oplus a_{K3} & a_{K0} \oplus a_{K1} \oplus a_{K2} \\ 0 & a_{K3} & a_{K3} & a_{K1} \oplus a_{K2} \end{matrix} \quad (10)$$

$T_k$ is different for each of the 15 bit positions of the code. It is therefore desirable not to calculate $T_k$ for every bit position separately.

Since every row in $T_k$ is a 4-element vector that can take only 16 different values, each element of $Q_K$ is one of the 16 possible XOR combinations of the syndrome bits $s_0$, $s_1$, $s_2$ and $s_3$. Therefore, these 16 XOR combinations need to be generated only once. The selection of the appropriate 4 out of 16 combinations for each of the individual bit positions K is determined by $T_k$.

The syndrome bits $s_0$, $s_1$, $s_2$, $s_3$ for $S_1$ are fed into an XOR tree 15 where they are decoded into all sixteen possible combinations of the XOR's of four syndrome bits. The output of the XOR tree 15 is fed to transformation matrix circuitry based on (10) which generates $Q_K$ for each bit position of the codeword. Each output of the transformation matrix $Q_K$ is then XOR'ed with the output of the XOR circuit 14 in a separate XOR circuit 18. Where the output of XOR circuit 14 is equal to any one of the column vector $Q_K$ the XOR circuit 18 will have a zero output for that bit position. This will be detected by one or two of the zero detectors 20 which then produces an output indication of the zero condition. An output indication of a zero condition from the detector 20 in one bit position i indicates a one bit error in the codeword. An indication from the detector 20 in two bit positions i and j tells that a double error has occurred.

For the purpose of determining if an uncorrectable error (UE) conditions exists, the outputs for all zero detectors 18 are fed into a counter 22. The output of the counter is fed to a logic circuit 24 which also receives the first syndrome bit p and a status signal of syndrome S. The logic circuit produces a UE condition when there is an even parity indication and the counter 22 indicates only one bit i is in error, when there is odd parity and the counter indicates there are two bits i and j in error or when the counter indicates no error and the syndrome vector is not zero.

The decoding apparatus and method described above can of course be extended to BCH codes with longer codewords such as those described in the above identified patent application. It is considerably faster then the decoding method described in that patent application while at the same time being economical in its use of logic circuits.

Therefore, it should be understood that many modifications and changes can be made in the illustrated embodiment without departing from the spirit and scope of the invention as represented in the attached claims.

Having thus described our invention, what we claim as new and desire to secure by Letters Patent is:

1. In an error correcting system based on a BCH multiple error correction code with $\alpha$ as a primitive element of the finite field GF ($2^m$) and with an H matrix where each column vector CK includes two m-tuples $\alpha^k$ and $\alpha^{3k}$ a method of locating bit positions K in error in a codeword generated by such a code comprising:
    (a) generating subsyndrome vectors $S_1$ and $S_2$ where $S_1$ is generated from column m-tuple $\alpha^k$ and S is generated from column m-tuple $\alpha^{3k}$,
    (b) generating $Q_K$ for each bit position by generating permutations of the syndrome vector $S_1$ corresponding to the bit positions,
    (c) selecting those bit positions K where $S_1^3 + S_2 + Q_K = 0$ as the bit or bits in error.

2. The method of claim 1 including providing an uncorrectable error indication when one bit of the codeword is indicated as being in error by step (c) and parity of the codeword is even, when two bits of the codeword are indicated as being in error by step (c) and parity of the codeword is odd or when the syndrome vector S of the codeword is not zero and no error is indicated as being in error by step (c).

* * * * *